US008986784B2

(12) United States Patent
Liu et al.

(10) Patent No.: US 8,986,784 B2
(45) Date of Patent: Mar. 24, 2015

(54) FINE DROPLET ATOMIZATION FOR LIQUID PRECURSOR VAPORIZATION

(71) Applicant: MSP Corporation, Shoreview, MN (US)

(72) Inventors: Benjamin Y. H. Liu, North Oaks, MN (US); Thuc M. Dinh, Shakopee, MN (US); Yamin Ma, Roseville, MN (US)

(73) Assignee: MSP Corporation, Shoreview, MN (US)

( * ) Notice: Subject to any disclaimer, the term of this patent is extended or adjusted under 35 U.S.C. 154(b) by 0 days.

(21) Appl. No.: 13/937,996

(22) Filed: Jul. 9, 2013

(65) Prior Publication Data

US 2013/0292485 A1 Nov. 7, 2013

Related U.S. Application Data

(62) Division of application No. 13/018,689, filed on Feb. 1, 2011, now Pat. No. 8,511,583.

(60) Provisional application No. 61/301,893, filed on Feb. 5, 2010.

(51) Int. Cl.

| | |
|---|---|
| ***B05B 17/04*** | (2006.01) |
| ***B05B 1/08*** | (2006.01) |
| ***B01F 3/04*** | (2006.01) |
| ***C23C 16/448*** | (2006.01) |

(52) U.S. Cl.

CPC ............. *B05B 17/04* (2013.01); *C23C 16/4486* (2013.01)

USPC .................................. 427/248.1; 427/255.23

(58) Field of Classification Search

CPC .............. B05B 17/04; B05B 1/08; B01F 3/04

USPC .......................................... 427/248.1, 255.23

See application file for complete search history.

(56) References Cited

U.S. PATENT DOCUMENTS

| | | | | |
|---|---|---|---|---|
| 4,684,064 | A * | 8/1987 | Kwok | 239/223 |
| 5,916,640 | A * | 6/1999 | Liu et al. | 427/475 |
| 6,244,575 | B1 | 6/2001 | Vaartstra et al. | |
| 6,548,112 | B1 | 4/2003 | Hillman et al. | |
| 2002/0192375 | A1 | 12/2002 | Sun et al. | |
| 2005/0147749 | A1 * | 7/2005 | Liu et al. | 427/248.1 |
| 2006/0093737 | A1 * | 5/2006 | Dick et al. | 427/180 |
| 2006/0169201 | A1 * | 8/2006 | Hwang et al. | 118/300 |
| 2007/0057083 | A1 * | 3/2007 | Bolz | 239/34 |
| 2007/0062465 | A1 | 3/2007 | Dando et al. | |
| 2007/0157881 | A1 * | 7/2007 | Yasuda et al. | 118/688 |
| 2008/0237372 | A1 | 10/2008 | Scheer | |

FOREIGN PATENT DOCUMENTS

| | | | |
|---|---|---|---|
| JP | 10330941 | A | 12/1996 |
| JP | 11323553 | A | 11/1999 |
| JP | 2005026599 | A | 1/2005 |
| JP | 2005113221 | A | 4/2005 |
| JP | 2009188266 | A | 8/2009 |

OTHER PUBLICATIONS

Donnelly, T.D., et al., "Using ultrasonic atomization to produce an aerosol of micron-scale particles". Review of Scientific Instruments 76, 113301 (2005), pp. 1-10.*

PCT International Search Report, Sep. 30, 2011.

PCT Written Opinion, Sep. 30, 2011.

Japanese Office Action for JP 2012-552037, dated Oct. 21, 2014.

* cited by examiner

*Primary Examiner* — Bret Chen

(74) *Attorney, Agent, or Firm* — Westman, Champlin & Koehler, P.A.; Z. Peter Sawicki; Amanda Prose

(57) ABSTRACT

A method for forming a droplet aerosol for vaporization and subsequent thin film deposition on a substrate. The method includes drawing a gas from a compressed gas source and drawing a liquid from a liquid source. The liquid and gas are conjoined in either a coaxial flow relationship or a radial flow relationship or an angular relationship between radial and coaxial flow wherein the gas engages the liquid to form droplets suitable for vaporization and subsequent thin film deposition on a substrate.

5 Claims, 6 Drawing Sheets

FINE DROPLET ATOMIZATION FOR LIQUID PRECURSOR VAPORIZATION

CROSS-REFERENCE TO RELATED APPLICATION

The present application is a divisional of and claims priority of U.S. patent application Ser. No. 13/018,689, filed Feb. 1, 2011, now granted U.S. Pat. No. 8,511,583, issued on Aug. 20, 2013, which is based on and claims the benefit of U.S. provisional patent application Ser. No. 61/301,893, filed Feb. 5, 2010, the contents of which are hereby incorporated by reference in their entirety.

BACKGROUND OF THE DISCLOSURE

Thin film deposition on a substrate for semiconductor device fabrication and other applications is frequently accomplished through a gas phase process using a gas/vapor mixture containing the precursor vapor needed for film formation. The mixture is usually introduced into a deposition chamber under suitable temperature and pressure conditions to form a thin film on the substrate. In the case of a precursor in liquid form, the precursor vapor can be generated by heating the liquid to a suitably high temperature. A carrier gas can then be bubbled through the liquid to saturate the gas with vapor to form the desired gas/vapor mixture. Alternatively, vapor can be generated by injecting the liquid directly onto a hot metal surface to vaporize the liquid and form vapor. At the same time, a carrier gas is also injected to carry away the vapor to produce the gas/vapor mixture. In recent years, liquid vaporization through direct liquid injection and droplet vaporization is increasingly used. In this process, the precursor liquid is injected into an atomization apparatus with a carrier gas to form a droplet aerosol comprised of small droplets suspended in the gas. The droplet aerosol is then heated to form a gas/vapor mixture in a heated vaporization chamber.

Precursor vaporization by atomization followed by droplet vaporization in the carrier gas has the advantage that droplets are vaporized while suspended in the gas. Heat is transferred indirectly from the heated vaporization chamber walls through the gas, then into the suspended droplets for vaporization. Direct contact between the liquid and a hot metal surface can be eliminated. Contact between the precursor liquid and a hot metal surface can cause the precursor to thermally decompose to form undesirable by products. Droplet vaporization can greatly reduce thermal decomposition to produce a high purity gas/vapor mixture to form thin films in semiconductor device fabrication. In addition, due to the evaporative cooling effect, the surface temperature of an evaporating droplet remains low, further reducing thermal decomposition that can occur in the liquid phase at sufficiently high temperatures.

While droplet vaporization has been used successfully in recent years to vaporize precursor chemicals for semiconductor device fabrication, many modern precursor chemicals are difficult to vaporize. The problem of thermal decomposition and by-product formation has remained as a result of design shortcomings in the liquid atomization apparatus. This is particularly true for high molecular weight precursors with a low vapor pressure. Such low vapor pressure precursors typically have a molecular weight higher than approximately 300. Their vaporization requires the use of comparatively high vaporization temperatures. Yet, these precursor chemicals are less stable and prone to thermal decomposition that can form by-products that are harmful to the semiconductor device being fabricated.

When liquid is introduced into a heated vaporization chamber through an atomizer, the small liquid flow passageway usually must pass through a high temperature region in which the liquid passageway itself becomes heated. Over time, decomposition products can form and accumulate in the small, heated liquid flow passageway and cause the passageway to become clogged. The accumulated decomposed material in the liquid flow passageway can also be dislodged and appear as a gas-borne contaminant in the gas/vapor mixture. These contaminants can be carried by the gas/vapor mixture into the deposition chamber and deposit on the substrate surface to contaminate the substrate. The result is increased surface particle count on the product wafer, and increased defects in the device, and the loss of product yield.

SUMMARY OF THE DISCLOSURE

The present disclosure relates to an apparatus and a method for forming a droplet aerosol for vaporization and subsequent thin film deposition on a substrate. The apparatus includes a mechanism to control the rate of liquid flow through the apparatus, the mechanism including a piezoelectric actuator to adjust the rate of liquid flow and an atomizing mechanism drawing gas from a compressed gas source such that when the gas source conjoins with the liquid, the liquid is atomized to form droplets suspended in the gas forming a droplet aerosol suitable for thin film deposition on a substrate.

The method includes drawing a gas from a compressed gas source and drawing a liquid from a liquid source. The liquid and gas are conjoined in either a coaxial flow relationship or a radial flow relationship or an angular relationship between radial and coaxial flow wherein the gas engages the liquid to form droplets suitable for vaporization and subsequent thin film deposition on a substrate.

DESCRIPTION OF THE EXEMPLARY EMBODIMENTS

Figure 1:
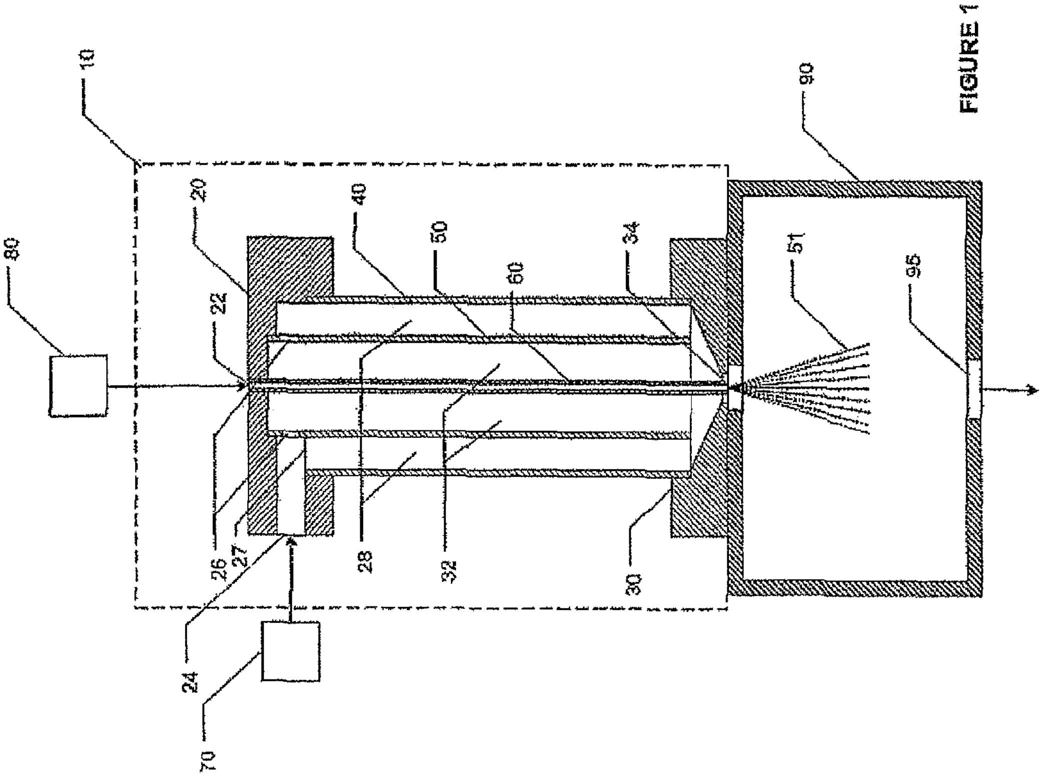
FIG. 1 is a schematic view of the atomization apparatus of one embodiment

FIG. 1 is a schematic diagram of one embodiment of the atomization apparatus. Like reference characters will be used for like elements throughout the Figures. The atomization apparatus is shown generally at 10. It is provided with a liquid source 80 containing a precursor chemical to be vaporized, and a compressed gas source 70 containing a carrier gas used for atomizing the liquid to form a droplet aerosol for vaporization. The atomization apparatus 10 is connected to a heated vaporization chamber 90 in which the droplet aerosol 51 produced by the atomization apparatus 10 is vaporized to faun a gas/vapor mixture. The resulting gas/vapor mixture then flows out of the vaporization chamber through outlet 95 into a deposition chamber (not shown) for thin film deposition and/or semiconductor device fabrication.

The atomization apparatus 10 is provided with a header 20 with a liquid inlet 22 for the precursor liquid from source 80 to enter, and a gas inlet 24 for the carrier gas from gas source 70 to enter. Upon entering inlet 22, the liquid flows down the small metal capillary tube 60 until it exits the other end of the capillary tube, which is open. At the same time carrier gas from source 70 enters the atomization apparatus through inlet 24. The gas then passes through openings 26 in inner tubular member 50 and opening 27 in outer tubular member 40 to form two separate streams. One stream flows downward through the gas flow passageway 28 formed between the outer tubular member 40 and inner tubular member 50. The other stream flows downward through the gas flow passageway 32 formed between inner tubular member 50 and the capillary tube 60. As these gas streams reach the lower end of the gas flow passageways, which are open, they combine to form a single stream. This gas stream then flows through the small orifice 34 to produce a high velocity gas jet, which atomizes the liquid flowing out of the end of the metal capillary to than a spray of fine droplets 51 in the heated vaporization chamber 90, the vaporization chamber being attached to the bottom flange 30 of the atomization apparatus.

The apparatus 10 is designed to operate in a vacuum environment, so that all parts of the system forming the outer envelope of the system including header 20 on the top, flange 30 on the bottom, and tubular member 40 on the side are constructed to avoid leaks. Header 20, flange 30 and tubular member 40 can be machined out of a single solid piece of metal, or fabricated as separate parts and welded together to form an overall leak free envelop for gas and liquid flow and atomization. Similarly, the bottom flange 30 is also attached to the vaporization chamber 90 through a leak-proof seal. All parts of the system including header 20, flange 30 and tubular member 40, and tubular member 50 and capillary tube 60 are usually made of stainless steel or other corrosion free metal to avoid contamination due to corrosion and erosion.

The atomization apparatus 10 is designed to operate with a heated vaporization chamber. For high molecular weight precursors, the vaporization temperature is typically greater than approximately 100 degree C. For some precursors, especially those that exist as a solid at room temperature, vaporization temperatures as high as approximately 350° C. or higher may be needed. For such solid precursors, the solid must be dissolved in a solvent and then atomized to form droplets to vaporize both the solvent as well as the solid precursor.

When precursor flows through a liquid flow passageway, such as metal capillary tube 60 of the atomization apparatus 10, it is important that the temperature of the liquid flow passageway be carefully controlled and kept low to avoid the precursor liquid from thermally decomposing while flowing through the metal capillary. In the case of a solvent-based solid precursor, the solvent may evaporate in a heated liquid flow passageway leaving the solid precursor behind to deposit in the small liquid flow passageway and cause it to clog. The manner in which the temperature of metal capillary tube 60 is controlled in the atomization apparatus 10 is described below.

Since all parts of the atomization apparatus 10 are constructed of metal, usually stainless steel, and the apparatus is attached to the heated vaporizer chamber 90 through the bottom flange 30, apparatus 10 is generally in good thermal contact with vaporization chamber 90. If the vaporization chamber 90 is operated at a temperature, for example, 130° C. to vaporize the precursor droplets produced by atomization apparatus 10, apparatus 10 with a design similar to that shown in FIG. 1, but without the special design considerations described below, will also be at a temperature close to the vaporization chamber temperature, i.e. 130° C. Since the atomization apparatus is protruding into an ambient environment, which is at a somewhat warmer temperature than the typical 20° C. temperature of a clean room, header 20 of apparatus 10 may be at a temperature somewhat cooler than the vaporization chamber temperature of 130° C. Metal capillary tube 60, which is in good thermal contact with header 20, will thus also be at a temperature that is somewhat cooler than the temperature of the vaporization chamber.

To reduce the temperature of header 20 and the temperature of the capillary tube 60, which is attached to the header and in good thermal contact with it, apparatus 10 is constructed of a thin wall tubular member 40 of a long length, the tube wall thickness and length being sufficient to produce a temperature drop of at least about 30° C. as heat is conducted from the heated vaporization chamber to the relatively cooler header 20. Since the capillary tube is in good thermal contact with heater 20, the temperature of the capillary, therefore, will also be about 30° C. or more cooler than header 20.

Conduction of heat through the walls of a tubular shaped member from one end to the other is governed by Fourier's law of heat conduction, $$Q = \frac{kA\Delta T}{L} \quad (1)$$

where Q is the rate of heat transfer from the hot end of the tube to the cooler end, k is the thermal conductivity of the tube, A is the cross-sectional area of the tube, L is the tube length, and ΔT is the temperature drop from the hot end to the cold end of the tube. For a thin-wall tube with a diameter, D, and wall thickness t, the cross-sectional area A is $$A=\pi Dt \quad (2)$$

The rate of heat conduction therefore will be $$Q = \frac{k\pi Dt\Delta T}{L} \quad (3)$$

Equation (3) shows that the rate of heat conduction through the tubular member 40 is directly proportional to the thickness, t, of the tube, and inversely proportional to its length. Reducing the thickness and increasing the tube length will decrease heat conduction through the tube. Since the cold end of the tube is connected to header 20 and at substantially the same temperature as header 20, heat transferred by conduction from the hot end to the cold end of the tube must be dissipated to the ambient by natural convection and radiation through the header. Reducing the rate of heat conduction to the cold end will thus reduce the temperature difference between header 20 and the temperature of the surrounding environment, and make the header temperature closer to the surrounding room temperature. The header will thus become cooler.

The above analysis shows that a simple and yet effective way of reducing the temperature of header 20, as well as the temperature of the capillary tube that is attached to it, is to make the wall thickness, t, of the tube thin or make the tube length, L, long, or both. Additionally, the carrier gas, upon entering gas inlet 24 and flowing through the gas flow passageways 28 and 32 will form two cold sheath flow streams.

One stream will flow through passageway 32 to help cool metal capillary 60 in the section below the header. The other stream will flow through passageway 28 to help cool the tubular housing 40, by carrying away additional heat that would otherwise be conducted through the tube into the header. By this means, the carrier gas that is used to atomize the liquid to form a droplet aerosol will be used additionally to help cool the header and the section of the capillary tube below the header to which it is attached.

Experiments have shown that the above approach can increase the temperature drop from flange 30 to header 20 and metal capillary tube 60 to about 90° C. without making the tubular walls too thin, or its length too long. The walls of the tubular housing 40 can only be made so thin due to operational pressures being below atmospheric. The thickness of the tubular housing must be able to withstand a vacuum. However, the thinner the tubular housing, the less will be the heat conduction from the vaporization chamber. In addition, the longer the tubular housing, the heat conduction will also be less. However, the tubular housing 40 should not be so long as to make the apparatus difficult to use. It will be appreciated that the length of the capillary tube 60 and the inner tubular member 50 will have to correspond to the length of the tubular housing 40.

Figure 2:
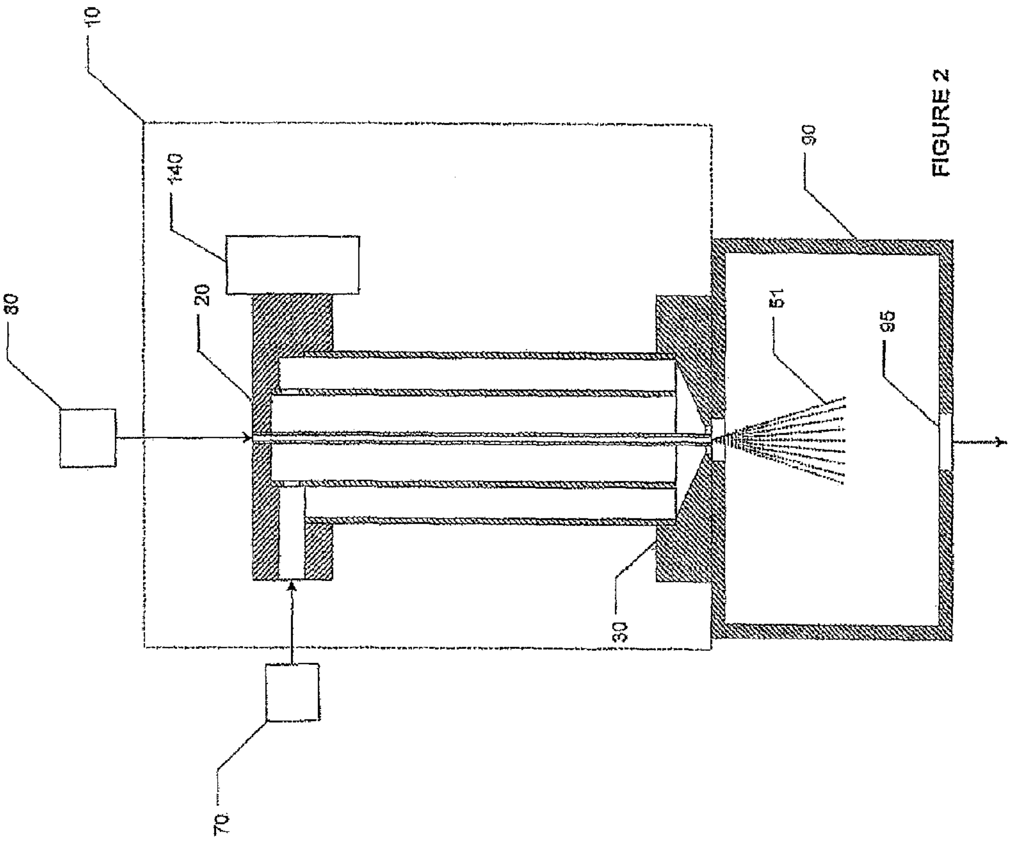
FIG. 2 is a schematic view of another embodiment of the atomization apparatus of the present disclosure.

FIG. 2 shows another embodiment of the apparatus of the present invention. All parts of the system are the same as those shown in FIG. 1 except for the addition of an extended surface heat exchanger 140. Heat exchange 140 is placed in good thermal contact with header 20, and has an extended surface area so heat can dissipate efficiently by natural convection. With the addition of heat exchanger 140 to provide additional area for heat dissipation, the temperature of header 20 can be further reduced, and brought closer to the ambient temperature around the apparatus.

Figure 3:
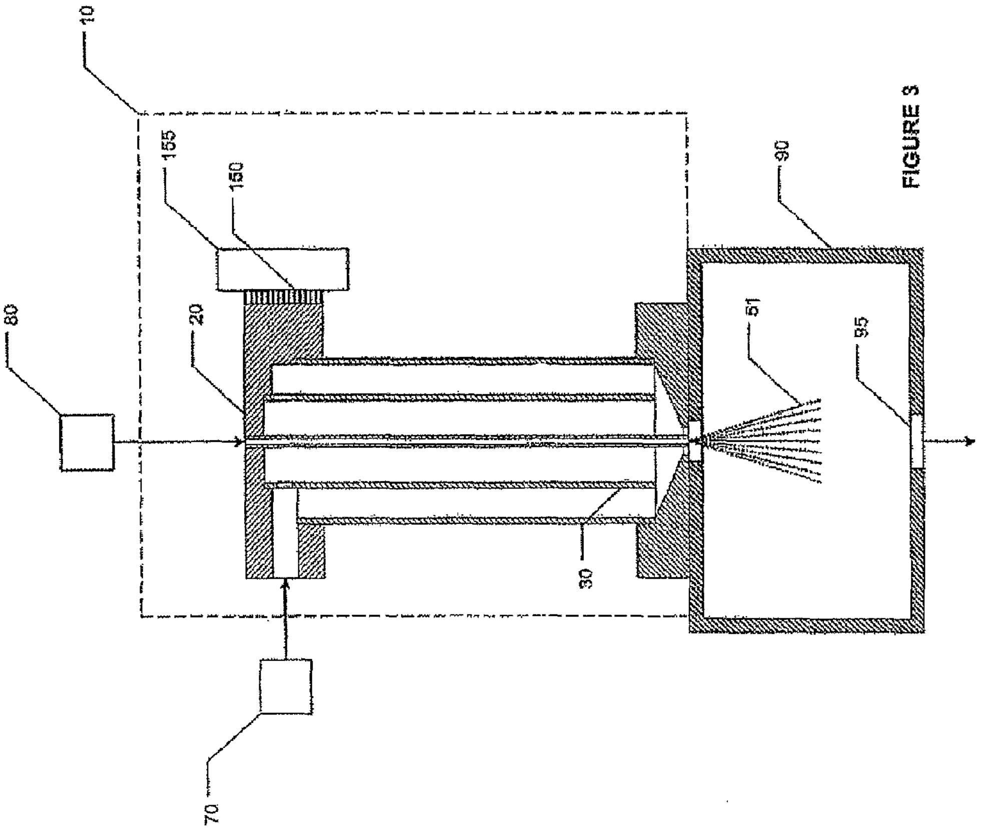
FIG. 3 is a schematic view of yet another embodiment of the atomization apparatus of the apparatus of the present disclosure

FIG. 3 is yet another embodiment of the apparatus of the present invention. All parts of the system are the same as in FIG. 1 except for the addition of a thermoelectric module comprised of a thermoelectric cooler element 150 and the attached natural convection cooling fins 155. The thermoelectric cooler is of a conventional design that can produce a cooling effect with the application of a DC current through the cooler. The heat removed is then dissipated by cooling fins to which the thermoelectric cooler is attached. The associated electrical and electronic circuitries needed to produce the desired DC current to produce the thermoelectric cooling effect are not shown as the technology is well known to those skilled in the art of cooling system design with the thermoelectric cooling effect. With the addition of a thermoelectric cooler, the header temperature can be maintained at near the ambient room temperature, or even below ambient temperature, thus making it possible to atomize liquid precursors at room temperature or below. This low temperature vaporizer is useful for vaporizer low vapor pressure precursors requiring a high vaporization temperature, or solid precursors dissolved in a solvent through the solution atomization process. Feeding a solution through a hot capillary tube will cause solvent to evaporate from the solution, leaving the solid precursor behind to clog the liquid flow passageway.

Other methods of cooling beyond those described in the present disclosure can also be used. These methods, including heat dissipation by using cooling water, cooling gas, or fan, etc, will be familiar to those skilled in the art of heating and cooling apparatus design, and will not be further described in this disclosure.

Figure 4:
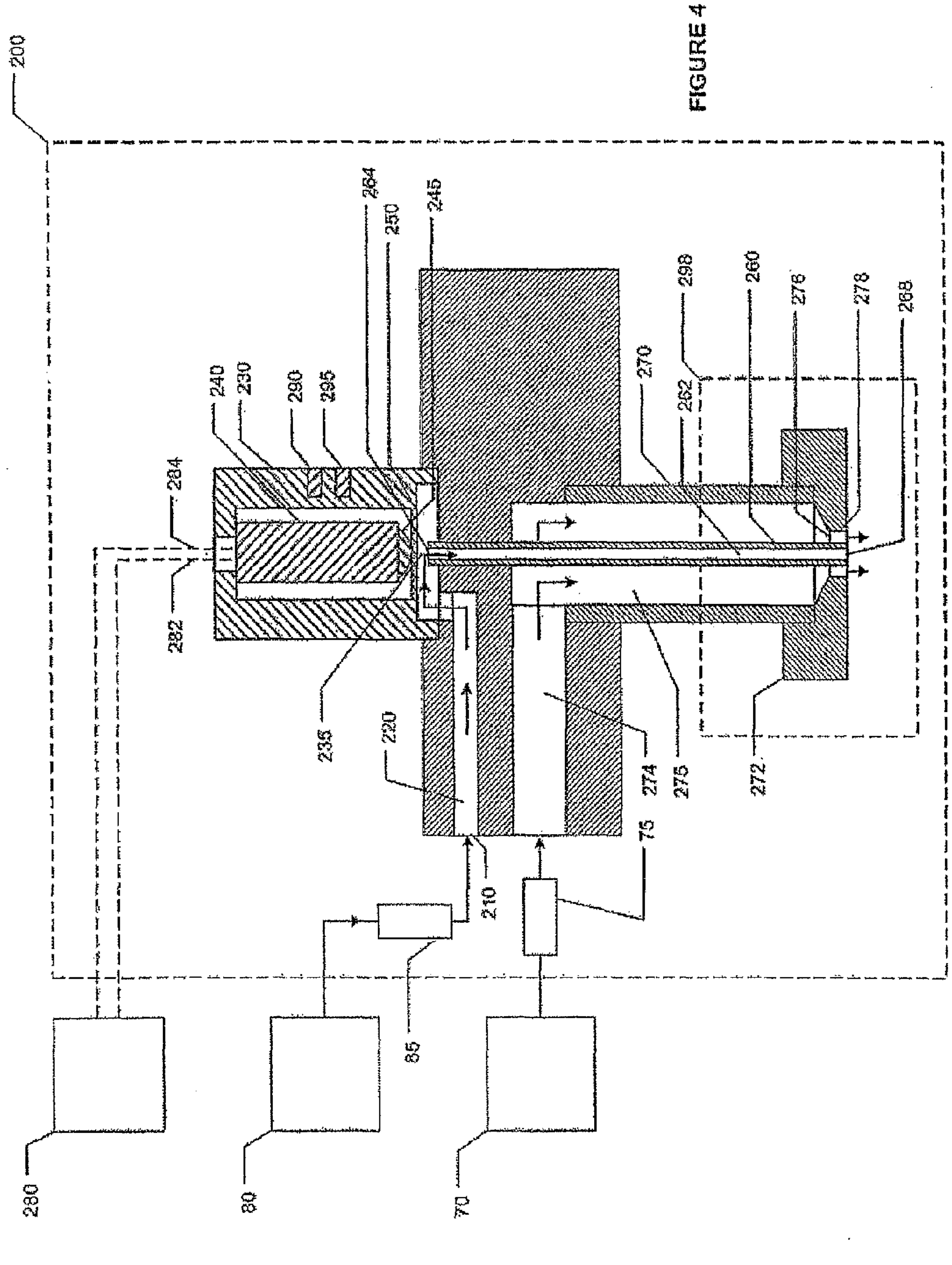
FIG. 4 is a schematic view of a liquid flow and atomizing apparatus in its preferred embodiment

FIG. 4 shows an apparatus of the present invention to control the rate of liquid flow and produce a droplet aerosol in its preferred embodiment. It includes an atomizing and liquid flow control apparatus 200 for delivering liquid at a specified rate and atomizing the liquid so delivered to form a droplet aerosol. The droplet aerosol then enters a heated vaporization chamber (not shown) to form a gas/vapor mixture for thin film deposition on a substrate. Precursor liquid in source 80 is pressurized and flows through liquid flow sensor 85 into liquid inlet 210. A thin metal diaphragm, 250, is positioned near the inlet opening 264 of the metal capillary tube 260 to form a small gap space, 235, between diaphragm 250 and liquid inlet opening 264 on the metal capillary 260, the gap space 235 being adjustable by means of piezoelectric actuator 240.

Piezoelectric actuator 240 is fabricated from a piezoelectric material that can expand or contract in response to the DC voltage from voltage source 280, the voltage from source 280 being applied through a pair of electric wires 282 and 284 to the piezoelectric actuator 240. The lower end of the piezoelectric actuator has a curved surface 245, which presses tightly against metal diaphragm 250 and is held tightly between the diaphragm and the housing 230, which is usually made of metal and is quite rigid. By applying a DC voltage of specific polarity and magnitude from voltage source 280, the piezoelectric actuator can be made to expand or contract, thereby changing its length and the gap spacing 235 between diagram 235 and liquid inlet opening 264. As a result the rate of liquid flow through the system will also change in response to the polarity and voltage applied by voltage source 280 on the piezoelectric actuator. A large gap space will cause the liquid flow rate to increase, while a small gap space will cause the liquid flow rate to decrease. Through feed-back electronic control, the rate of liquid flow from source 80 can be controlled to a specific set-point value, based on the electrical output of liquid flow sensor 85 and the polarity and magnitude of the applied DC voltage from the voltage source 280.

To prevent thermal expansion or contraction of housing 230 from affecting the operation of the piezoelectric actuator in controlling the liquid flow rate, a temperature sensor 290 and a heater 295 are provided in order to control the housing temperature to a specific value above the ambient, thus preventing change in ambient temperature from affecting the length of the housing and the operation of the piezoelectric actuator.

Upon entering the capillary inlet 264 the liquid will flow through the liquid flow passageway 262 in metal capillary 260 and then flows out of the outlet opening 268 at the exit end of the metal capillary. At the same time, carrier gas from source 70 flows through gas flow sensor 75 into the inlet end of the gas flow passageway, the gas flow passageway having a horizontal section 274 and a vertical section 275 in atomizer body 270, which is generally cylindrically shaped. The gas flow then passes out of the atomizer body 270 through annular space 276 between the cylindrically shaped metal capillary tube 260 and the exit orifice 278, which is also cylindrically shaped, to form a high velocity gas jet. This high velocity gas jet then atomizes the liquid flowing out of metal capillary outlet 268 to form a droplet aerosol. The droplet aerosol then flows through a heated vaporization chamber (not shown) in order to form a gas/vapor mixture for thin film deposition on a substrate.

The design of the atomizing head shown at 298 of atomizing and liquid flow control apparatus 200 is based on a coaxial flow design. In this design, the liquid and gas flow through liquid outlet 268 and the annular gas outlet 276 respectively are both moving in the same axial direction along the axis (not shown) of metal capillary 260. This atomizer head design is generally adequate for many applications. In more demanding applications, smaller droplets are desired in order to make the apparatus acceptable.

Figure 5:
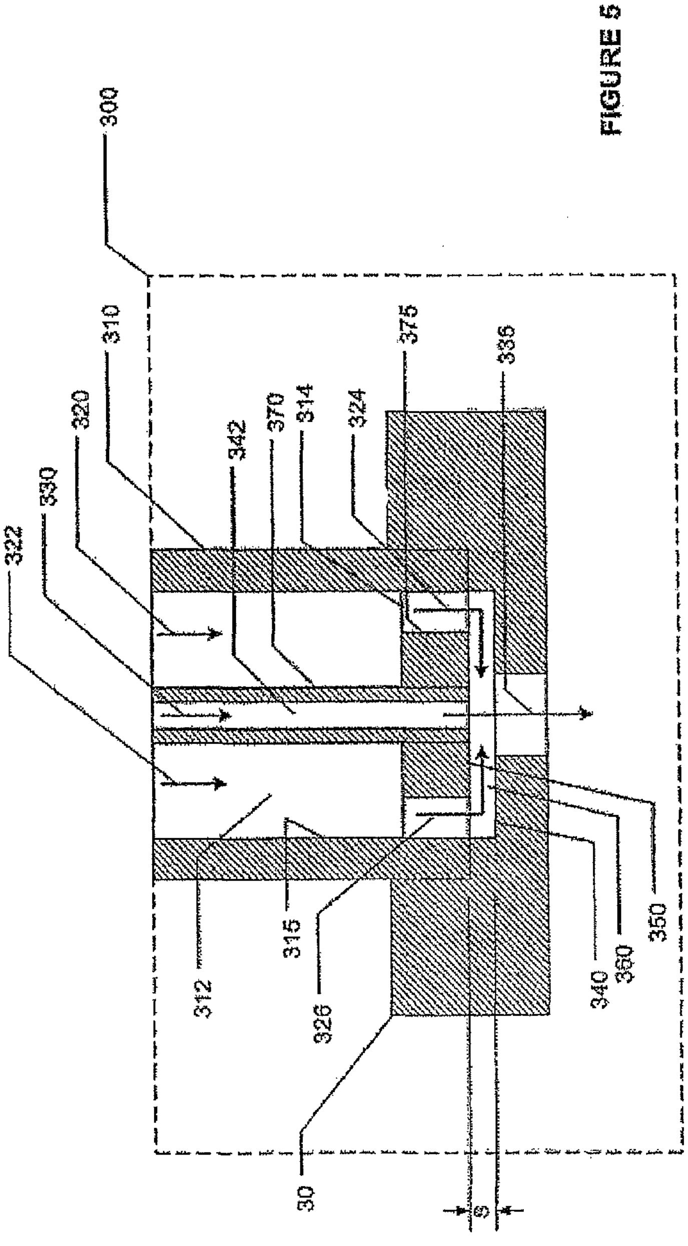
FIG. 5 is the radial-flow atomizing head showing the atomizing head of the present invention in its preferred embodiment

FIG. 5 shows another embodiment of the atomizer head described in the present disclosure. In this design, the gas flow illustrated by arrows 320 and 322 in the atomizer head 300 initially flows in a generally downward in the axial direction. This gas flow then passes through the annular space 314 formed between the outer wall 315 of the gas flow passageway 312 in the tubular atomizer body 310 of the atomizer head, and the outer surface of head piece 314 near the bottom of metal capillary 370. The gas flow in this annular gas flow passageway 314 is forced to make a 90 degree turn as shown by arrows 324 and 326 in the horizontal section of gas flow passageway 360 bounded by lower and upper surfaces 340 and 350.

The width of gas flow passageway 360 is shown to be quite wide for purpose of clarity. In actual practice, the distance S between the lower and upper surfaces 340 and 350 forming the boundary surfaces of the gas flow passageway is quite small. The distance S is generally less than 1.0 mm and can be made much smaller so that the velocity of gas flow at a given rate of volumetric or mass rate of flow can be made much higher. As this high-velocity gas flow impinges on the liquid stream 335 flowing out of the metal capillary through the liquid flow passageway 342, it compresses the liquid stream causing it to become smaller in diameter. This smaller diameter liquid stream then becomes atomized to form a fine droplet spray. This fine-droplet spray then mixes with the carrier gas to form a fine droplet aerosol for vaporization to form a gas/vapor mixture.

Ideally the gas flow through the small gas flow passageway 360 is at sonic speed in order to produce droplets of a very small droplet size. In practice, the gas flow velocity can be as low as one tenth, i.e. 0.1 of the speed of sound and still quite adequate to produce a droplet aerosol spray of a sufficiently small diameter for many applications. The speed of sound in nitrogen under standard temperature and pressure conditions is approximately 340 m/s. The atomizing gas velocity that can be used to achieve the desired droplet diameter can lie in the range from 34 m/s to 340 m/s.

The atomizer head design of FIG. 4 and FIG. 5 can be respectively referred to as the axial flow atomizer, and radial flow atomizer. In the axial flow design of FIG. 4, the gas flow is along the vertical axis of metal capillary 370. In the radial flow design of FIG. 5, the gas flow is radial, i.e. a perpendicular direction to the axis of the metal capillary. Hence, it is also perpendicular to the direction of liquid flow. The radial flow design has been found to produce greater degree of atomization in order to form a fine droplet aerosol compared to the axial flow design.

Figure 6:
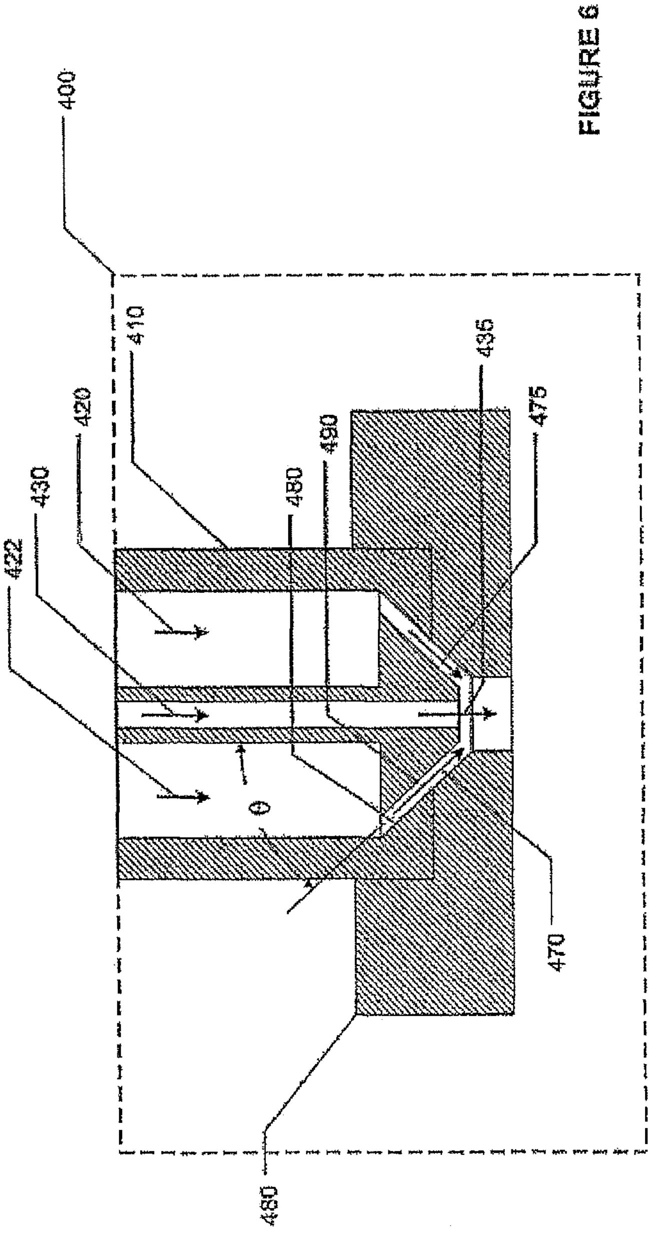
FIG. 6 is the angular flow atomizing head

FIG. 6 shows yet another design of the atomizing head. In this design the gas flow is confined between the two conical surfaces 480 and 490 along the directions shown by arrows 470 and 475. The gas flow is thus in an angular relation to the liquid flow, the angle $\theta$ between the gas and liquid flow streams can be varied between 0 and 180 degrees. This particular design can be referred to as the angular flow atomizer. The axial and radial flow atomizers can thus be seen as a special case of the angular flow atomizer, with the axial flow design being achieved with $\theta=0$ degree and the radial flow design being achieved with $\theta=90$ degree.

Although the present invention has been described with reference to preferred embodiments, workers skilled in the art will recognize that changes may be made in form and detail without departing from the spirit and scope of the invention.

What is claimed is:

1. A method for atomizing a precursor liquid in a gas to form a droplet aerosol, the method comprising:
- drawing a gas from a compressed gas source;
- drawing a liquid from a liquid source;
- the liquid and gas conjoined in a radial flow atomizing head wherein direction of the gas flow in the radial flow atomizing head is radial and perpendicular to the direction of liquid flow in the radial flow atomizing head; and
- wherein the gas impinges on the liquid flow to form droplets for vaporization and thin film deposition on the substrate.

2. The method of claim 1 wherein the gas flow is at least approximately 0.1 of the speed of sound.

3. The method of claim 1 wherein the gas engages the liquid in a substantially perpendicular orientation.

4. A method for atomizing a precursor liquid in a gas to form a droplet aerosol, the method comprising:
- drawing a gas from a compressed gas source;
- drawing a liquid from a liquid source;
- the liquid and gas conjoined in an angular flow atomizing head wherein the gas impinges on the liquid in an angular flow in the angular flow atomizing head, such that the direction of the gas flow in the atomizing head is in an angular relation to direction of the liquid flow, the angular relation between approximately 0° and 180° with respect to horizontal.

5. The method of claim 4 wherein the gas flow is at least approximately 0.1 of the speed of sound.

* * * * *